(12) United States Patent
Kawata

(10) Patent No.: US 6,326,267 B1
(45) Date of Patent: Dec. 4, 2001

(54) METHOD OF FORMING NON-VOLATILE SEMICONDUCTOR MEMORY

(75) Inventor: Masato Kawata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,731

(22) Filed: May 14, 1999

(30) Foreign Application Priority Data

May 18, 1998 (JP) ................................................ 10-135589

(51) Int. Cl.⁷ .............................................. H01L 21/8247
(52) U.S. Cl. .......................................................... 438/258
(58) Field of Search ..................................... 438/257–267

(56) References Cited

U.S. PATENT DOCUMENTS

| | | | |
|---|---|---|---|
| 5,658,812 | * 8/1997 | Araki | 438/258 |
| 5,663,084 | 9/1997 | Yi et al. | |
| 5,846,861 | * 12/1998 | Saitoh | 438/258 |
| 5,908,311 | * 6/1999 | Chi et al. | 438/258 |
| 6,004,847 | * 12/1999 | Clementi et al. | 438/258 |

FOREIGN PATENT DOCUMENTS

| | | |
|---|---|---|
| 58-137259 | 8/1983 | (JP) . |
| 58137259 | 8/1983 | (JP) . |
| 7-335738 | 12/1995 | (JP) . |
| 7335738 | 12/1995 | (JP) . |
| 864706 | 3/1996 | (JP) . |
| 9-246409 | 9/1997 | (JP) . |
| 9-232454 | 9/1998 | (JP) . |
| 11-111936 | 4/1999 | (JP) . |
| 11111936 | 4/1999 | (JP) . |
| 138312 | 12/1995 | (KR) . |

\* cited by examiner

*Primary Examiner*—Richard Booth
(74) *Attorney, Agent, or Firm*—Young & Thompson (57) ABSTRACT

A non-volatile semiconductor, memory manufacturing method, according to the present invention, comprises: the process steps of depositing a layer of floating gate material such as a polysilicon layer, and an insulation layer such as a silicon oxide layer, a silicon nitride layer, or the combination of the above, on the surface of a semiconductor substrate, wherein, multiple device isolating layers, for isolating adjacent devices, have been formed on the substrate; and etching the layers deposited in a peripheral region of the non-volatile semiconductor memory. The non-volatile semiconductor memory comprises the peripheral region and a memory region. Through the above process steps, the multiple device isolating layers are maintained, as they are, without possible partial losses.

12 Claims, 7 Drawing Sheets

METHOD OF FORMING NON-VOLATILE SEMICONDUCTOR MEMORY

BACKGROUND OF THE INVENTION

1. Field of the Invention

The present invention relates to a method of forming a non-volatile semiconductor memory which comprises the region of a peripheral circuit and a cell region on a semiconductor substrate, which has an advanced device isolating characteristic.

2. Description of the Related Art

The conventional method of manufacturing a flash memory will be explained, with reference to drawings.

Figure 1:
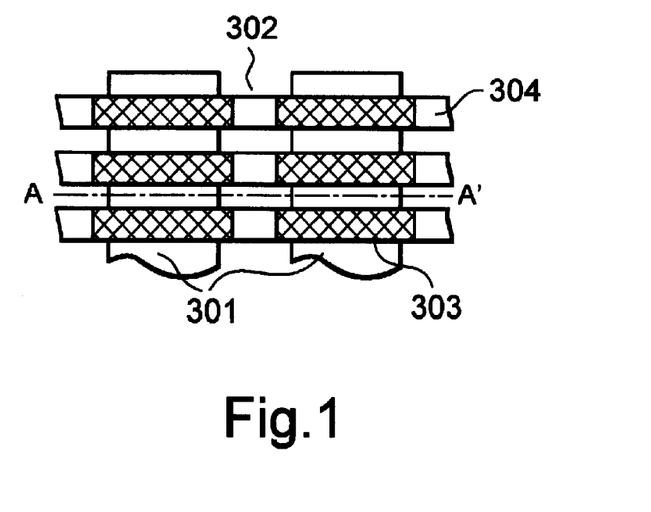
FIG. 1 illustrates an aerial view of a cell region of the conventional flash memory.

FIG. 1 shows the configuration of the conventional flash memory, fabricated at the halfway manufacturing stage, just before the step of making an interconnection in a cell region. Source and drain regions are formed in diffused layer regions 301. Floating gates 303 are formed in hatched regions in the figure. Word lines 304, which also play a role as control electrodes, are formed over the floating gates 303. Device isolating oxide regions 302 are formed in the respective regions, between the adjacent left and right regions of diffused layer 301. Tunnel oxides, each playing a role for the generation of a channel region, are formed right under the floating gates 303, but not in the device isolating oxide regions 302.

The conventional method of manufacturing the flash memory will be explained below, with reference to process cross sections in FIGS. 2A to 9A and 2B to 9B. In these figures, FIGS. 2A to 9A show cross sections of the region of the peripheral circuit of the flash memory, whereas FIGS. 2B to 9B show cross sections of a cell unit region of the flash memory. No transistors are formed in the cell unit region, whereas necessary transistors are formed in the region of the peripheral circuit.

Figure 2A:
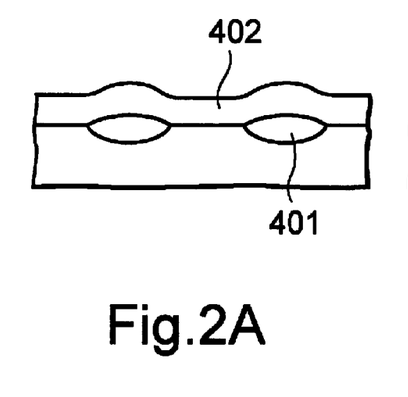
Figure 2B:
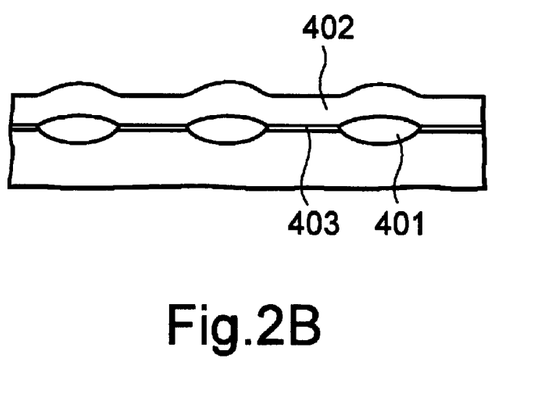

Firstly, device isolating oxide layers 401, each having a thickness of approximately 4000 to 5000 angstroms, are formed on a semiconductor substrate by using the LOCOS (Local Oxidation of Silicon) method, etc., followed by the formation of a tunnel oxide layer 403, having a thickness of 100 angstroms or less, in a device region of the flash memory. A polysilicon layer 402 is deposited next, all over the surface (see FIG. 2). Floating gates are formed from the polysilicon layer 402, in the next step. Phosphorous (p), generally, is implanted next, in the polysilicon layer 402, which has a thickness of approximately 1500 angstroms.

Figure 3A:
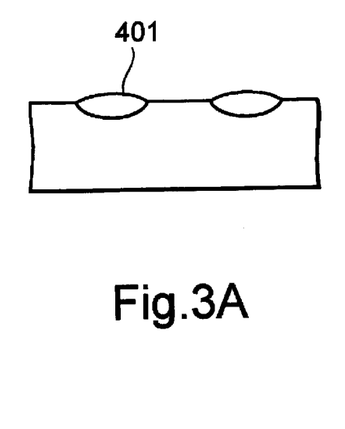

Next, a photo resist (not shown in figures) is patterned by utilizing the conventional photographic process. Thereafter, floating gates 404 are formed by etching the polysilicon (see FIG. 3B). At this time, with the region of the peripheral circuit not covered by a resist, the polysilicon layer 402 of the region is removed (FIG. 3A).

Figure 4A:
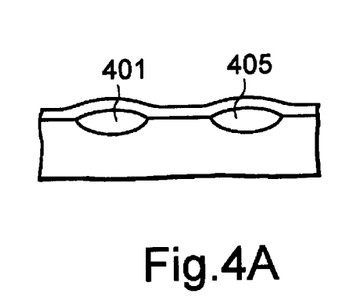
Figure 4B:
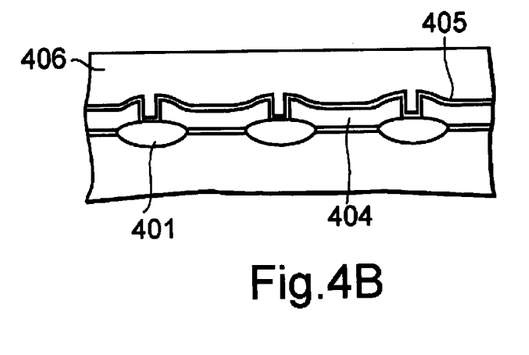

Thereafter, an insulation layer 405 is deposited all over the surface. The insulation layer 405 is used to isolate control gates from respective floating gates. The insulation layer 405, which is an ordinary multiple layered structure of silicon oxide layer/silicon nitride layer/silicon oxide layer, has a thickness of 180 angstroms or less, if it is converted into the thickness of an oxide layer. To remove the insulation layer 405 in the region of the peripheral circuit, a resist 406 is coated next, all over the cell unit region (FIG. 4B).

The insulation layer 405, in the region of the peripheral circuit, is then etched. At this time, a gate oxide layer is formed on the region, where the device isolating oxide layers 401 do not exist. Therefore, the insulation layer 405 formed over the region has to be completely removed. Accordingly, it needs to be adequately over-etched. However, the etching selectivity of the insulation layer 405 to the device isolating oxide layer 401, which is located under the insulation layer 405, cannot be set to a high value. This causes a partial loss of the device isolating oxide layer 401 in the region of the peripheral circuit.

Figure 5A:
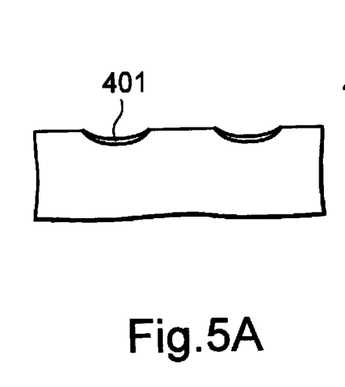
Figure 5B:
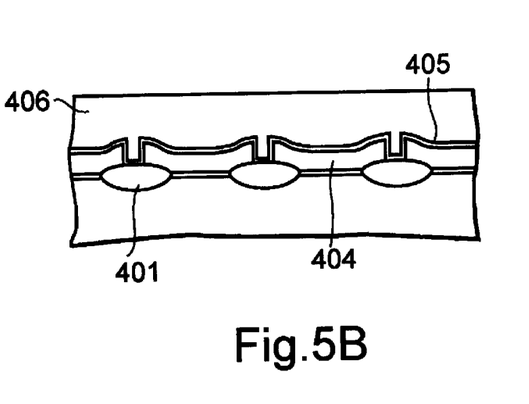

Thereafter, a gate oxide layer 407, used for making up the transistors in the region of the peripheral circuit, is formed by utilizing an ordinary, thermal oxidation process.

Figure 6A:
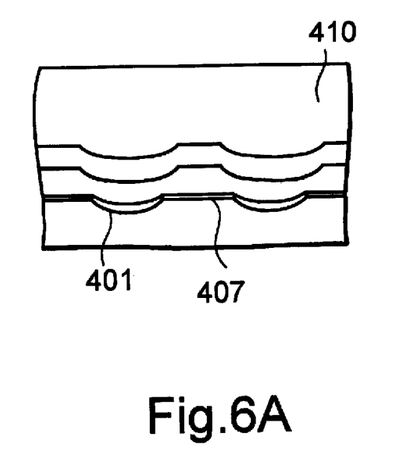
Figure 6B:
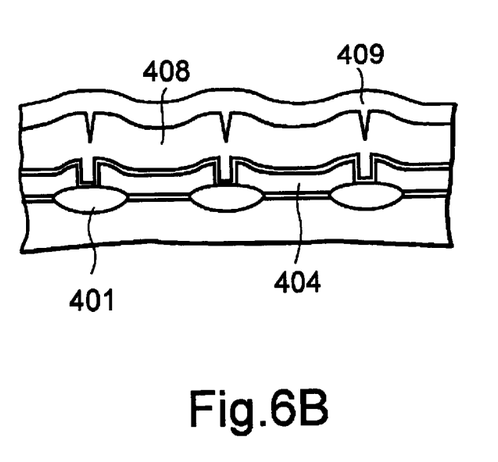

After removal of the resist 406, a polysilicon layer 408, in which phosphorous has been implanted and a silicide layer 409 are deposited systematically all over the substrate. Each of them has a thickness of approximately 1500 angstroms. The polysilicon layer 408 and the silicide layer 409 are to become gate electrodes of transistors in the region of the peripheral circuit and control electrodes of transistors in the cell unit region, at the same time. Thereafter, in order to etch so as to form cell gates (hereafter, referred to as cell gate etching), the entire region of the peripheral circuit and predetermined places in the cell unit region, are covered with a resist 410 (FIG. 6A). Note that no electrode is formed in the cross section of the cell unit region, as shown in FIG. 6B. Accordingly, a resist 410 is not prepared, as shown in the structure in FIG. 6B.

Figures 7A, 7B:
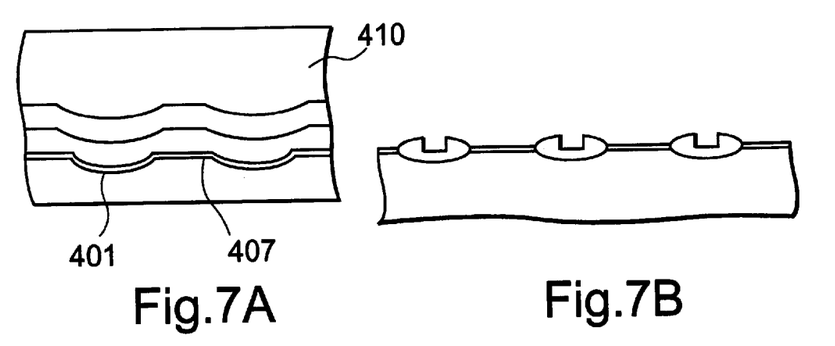

To form electrodes in the cell unit region, cell gate etching is performed next. The state after etching is shown in FIG. 7. It is noted that no cell gate is shown in the region because FIG. 7B shows a cross section along the line A–A' in FIG. 1.

Figure 8A:
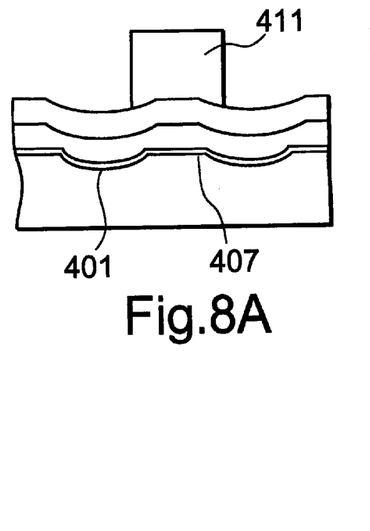
Figure 8B:
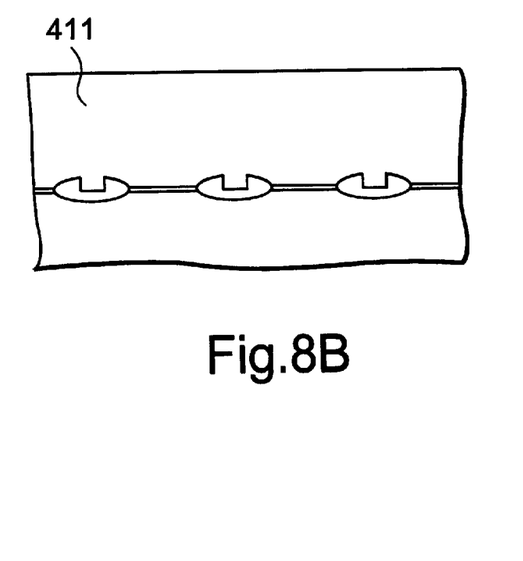
Figure 9A:
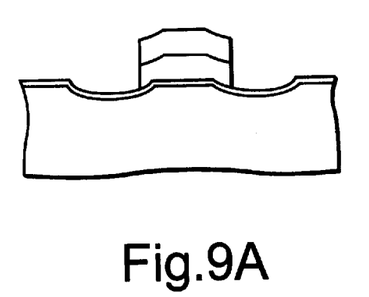
Figure 9B:
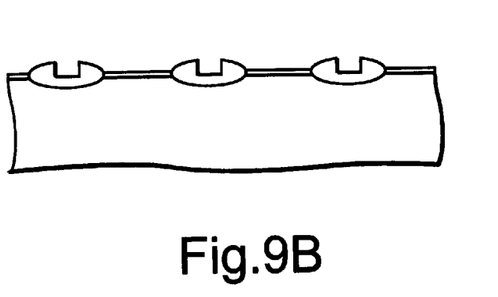

Thereafter, source and drain regions (not shown in figures) are formed, in the cell unit region. All cell unit regions, and predetermined places, where gates are to be formed, are covered with a resist 411 (see FIG. 8). Gate electrodes are then formed in the region of the peripheral circuit, by etching (FIG. 9A).

Source and drain regions are formed next, in the region of the peripheral circuit and thereby, transistors are completed in the region of the peripheral circuit. A flash memory is completed next, through an ordinary contact construction process and an ordinary interconnection process.

Figure 3B:
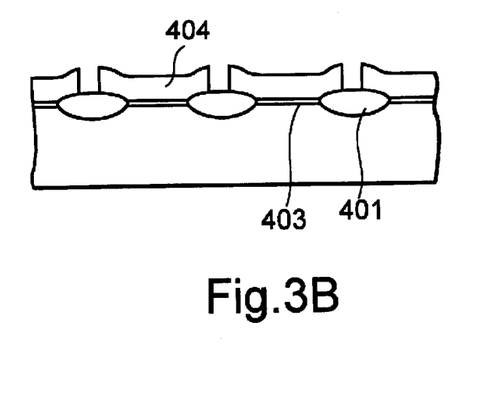

However, in the above conventional techniques, removing the polysilicon layers of the floating gates, in the region of the peripheral circuit and removing the polysilocon layers of the floating gates, in the cell region, are performed at the same time (see FIG. 3). This causes a deposition of an insulation layer directly on top of the device isolating oxide layers, in the region of the peripheral circuit (FIG. 4A). However, in the subsequent etching step of removing the insulation layer, in the region of the peripheral circuit, the etching selectivity of the insulation layer to the device isolating oxide layer, which is located under the insulation layer, cannot be set to a high value. This causes a partial loss of the device isolating oxide layers in the region of the peripheral circuit (see FIG. 5A). This loss results in a deterioration of the device isolating properties on the polysilicon interconnects, which run on the device isolating layers in the region of the peripheral circuit. In addition to that, in the subsequent step of implanting ions and forming source and drain regions of transistors, in the region of the peripheral circuit. The ions possibly pass through the device isolating oxide layers, which make it easier to generate a channel, right under each device isolating oxide layer. This causes further degradation to the device isolating properties.

SUMMARY OF THE INVENTION

Accordingly, the objective of the present invention, is to provide a non-volatile semiconductor memory, with an advanced device isolating characteristic, together with a manufacturing method.

According to an aspect of the present invention, a method of manufacturing a non-volatile semiconductor memory is provided, comprising the steps of: forming a plurality of device isolating layers on a semiconductor substrate; depositing a layer of floating electrode material on the surface resulting from the step of forming layers, forming an insulation layer on the surface resulting from the step of depositing, and removing the layer of floating electrode material deposited and the insulation layer formed, in the order as written above. An example of the method of manufacturing a non-volatile semiconductor memory is illustrated in FIGS. 11 to 17.

Figure 14A:
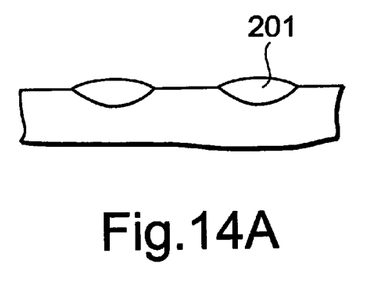
Figure 14B:
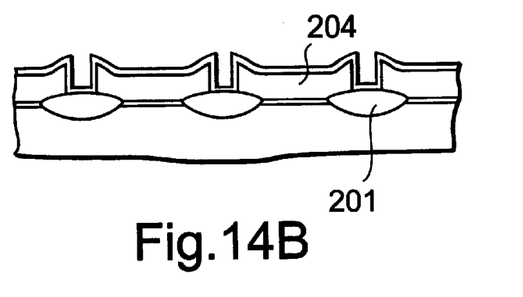

According to another aspect of the present invention, a non-volatile semiconductor memory with advanced, device isolating characteristics is provided, comprising a substrate, and a plurality of convex insulation layers, each isolating adjacent, semiconductor devices. An example of the configuration of the non-volatile semiconductor memory, is illustrated in FIG. 14.

BRIEF DESCRIPTION OF DRAWINGS

The above and other objects, features and advantages of the present invention, will become apparent from the following detailed description, in the embodiment section, when taken in conjunction with the accompanying drawings, wherein:

FIGS. 2A and 2B to 9A and 9B illustrate process cross-sections, showing the respective steps of manufacturing the conventional flash memory;

FIGS. 11A and 11B to 17A and 17B illustrate process cross-sections, showing the respective steps of manufacturing the flash memory according to the present invention;

DETAILED DESCRIPTION OF THE PREFERRED EMBODIMENTS

Figure 10:
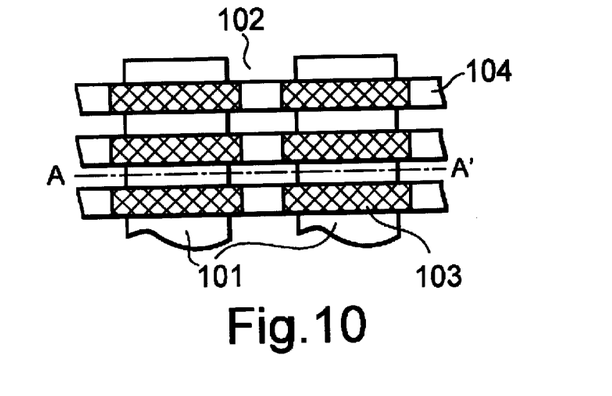
FIG. 10 shows an aerial view of a cell region of a flash memory, according to the present invention.

Hereafter, a flash memory manufacturing method according to an embodiment of the present invention, will be described, with reference to process cross sections of FIG. 10, FIGS. 11A to 17A, and FIGS. 11B to 17B. FIG. 10 illustrates the configuration of a cell region, in a flash memory, according to the present invention. FIGS. 11A to 17A show the region of a peripheral circuit of the flash memory, whereas FIGS. 11B to 17B show a cell region of the flash memory.

Figure 11A:
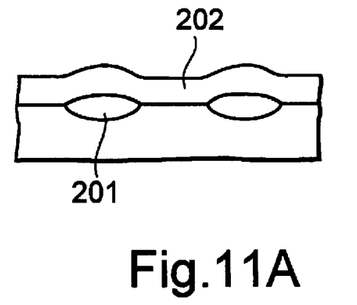
Figure 11B:
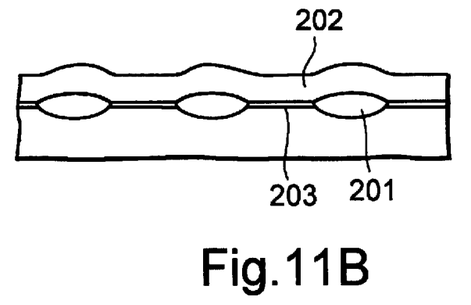

Firstly, as shown in FIGS. 11A and 11B, device isolating layers 201 are formed at given places, in the region of the peripheral circuit of the flash memory and at given places in the cell region of the flash memory. This is followed by a deposition of a layer of floating electrode material (polysilicon layer 202), all over the substrate. The device isolating layers 201 are made of a silicon oxide. For example, a conductive, semiconductor material or a metal material, specifically, polysilicon, aluminum (Al), titanium nitride (TiN) or Copper (Cu), etc. are used as material for the floating electrodes.

A resist layer is formed next, over given places in the cell region and all over the region of the peripheral circuit. The layer of floating electrode material, formed in the cell region, is then, subjected to an etching process, so as to form floating gates. For example, as shown in FIG. 12B, the entire layer of floating electrode material, deposited on the device isolating layers 201, in the cell region, or part of it, is removed by etching, to form holes. Thereby, the layer of floating electrode material is patterned, forming floating gates 204, in the cell region.

Figure 13A:
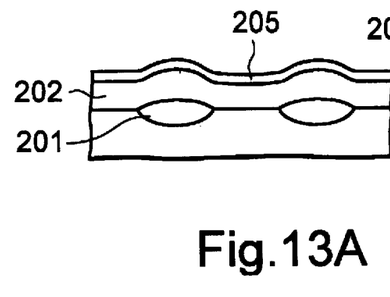
Figure 13B:
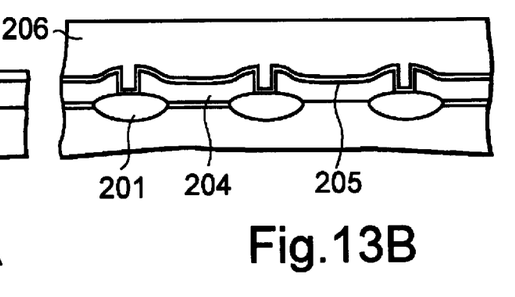

An insulation layer 205 is deposited next, all over the substrate (FIGS. 13A and 13B). A silicon oxide layer or a silicon nitride layer is used for the insulation layer 205. Alternatively, a combination of the above two, can be used for the layer. A resist layer is deposited next, all over the cell region (FIG. 13B). Wherein, no resist layer is formed in the region of the peripheral circuit. In this situation, the insulation layer 205 and the layer of floating gate material 202, formed in the region of the peripheral circuit, are removed in the order, as written above (FIG. 14A). In the subsequent step, a gate oxide layer is formed, in a region, where no device isolating oxide layers 201 are formed, in the region of the peripheral circuit, as shown in FIG. 14B. Accordingly, to completely remove the polysilicon layer 202, formed over the region, a suitable amount of over-etching is required. In this embodiment, the etching selectivity of the polysilicon layer 202, to the device isolating oxide layers 201, which are located under the polysilicon layers 202, can be set to a high value. This prevents a possible loss of the device isolating oxide layers 201, in the region of the peripheral circuit, from occurring even though the polysilicon layer 202, is over-etched (see FIG. 14A). Thus, the enhanced, device isolating characteristics are maintained. Conversely, using the conventional techniques causes an occurrence of losses of the device isolating oxide layers 401, as shown in FIG. 5A. In this respect, the flash memory manufacturing method, according to the present invention, is different from and superior to, the conventional ones.

Figures 15A, 15B:
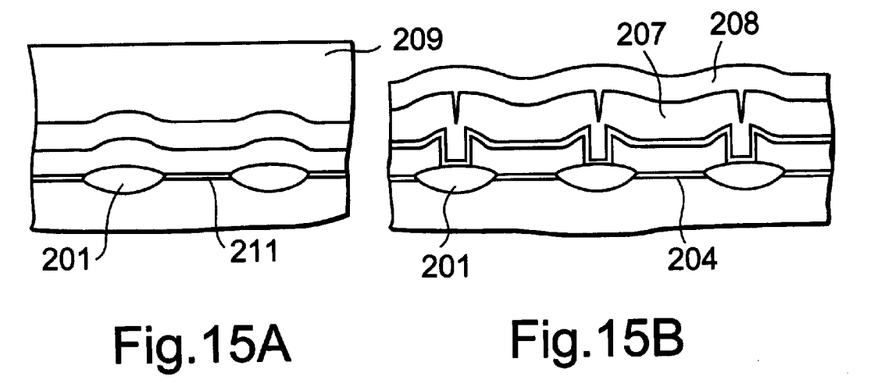

Predetermined, material layers, which will become electrodes, are deposited next, all over the substrate. For example, layers, such as a polysilicon layer 207 and a silicide layer 208 are deposited, in the order, as written above, and contained in this embodiment (FIGS. 15A and 15B). It is preferable to dope an impurity, such as phosphorous, in the polysilicon layer 207, in order to improve its conductivity.

Thereafter, the layers of electrode material, deposited in the cell region, are etched, to form control electrodes. The layers of electrode material, deposited in the region of the peripheral circuit are also etched, to form gate electrodes. It is noted that the order of performing these two formation processes, is flexible.

Figure 16A:
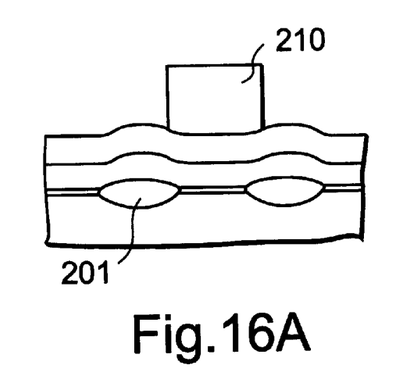
Figure 16B:
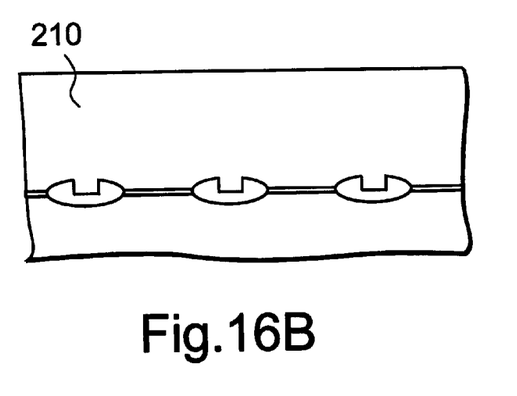

In this embodiment, the formation of the control electrode in the cell region, for example, is made first. This formation process will be described next, in more detail. A resist 209 is first formed, all over the region of the is peripheral circuit and on predetermined places in the cell region (see FIGS. 15A and 15B). FIG. 15B illustrates a cross-section of the cell region, along a line A–A' in FIG. 10, where no electrodes are formed. No resist 209 is formed in the cell region, as shown in FIG. 15B, whereas, the resist 209 is formed in the region of the peripheral circuit, as shown in FIG. 15A. The regions are etched, by using a predetermined, pattern mask, to form control electrodes. Thereby, in the cell region, where no electrodes are formed, the device isolating layers, having concave shapes, as shown in FIG. 16B, are formed.

Figure 17A:
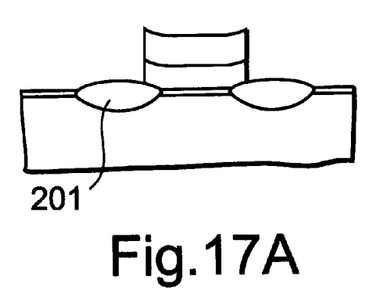

A resist 210 is formed next, all over the cell region and on predetermined places, in the region of the peripheral circuit (FIGS. 16A and 16B), and etched, by using a predetermined, pattern mask, to form gate electrodes in the region of the peripheral circuit (FIG. 17A).

Thereafter, transistors in the region of the peripheral circuit are completed, by forming source and drain regions. A flash memory is completed next, by subjecting it to a contact process and an interconnection process.

In the second embodiment, a more detailed method of manufacturing a flash memory, according to the present invention, will be explained, with reference to FIGS. 10, 11A to 17A, and 11B to 17B.

FIG. 10 shows an aerial view of a cell region in a flash memory, according to the present invention, which is fabricated at the half way manufacturing stage, just before a cell interconnection process step is performed. In FIG. 10, source regions and drain regions are formed, in diffused layers 101. Floating gates 103 are formed in hatched regions. Word lines 104 are formed over the respective, floating gates 103, and serve as, control electrodes too. A device isolating oxide layer 102, is formed in the region, sandwiched by the adjacent left and right diffused layer region 101. Tunnel oxide layers are formed, in the regions right under the floating gates 103, but not in the device isolating oxide layer 102, for the generation of channels.

Figure 17B:
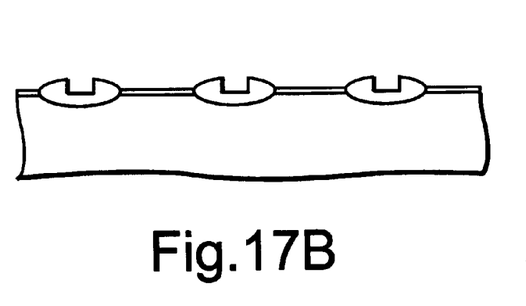

Next, the method of manufacturing a flash memory, according to the present invention, will be explained in more detail, with reference to FIGS. 11A to 17A, and 11B to 17B. As described before, FIGS. 11A to 17A show cross sections of the region of the peripheral circuit, in the flash memory, whereas FIGS. 11B to 17B show cross sections of a cell region, in the flash memory, along the line A–A' in FIG. 10. Transistors are to be formed in the region of the peripheral circuit, but no transistor is to be formed in the cell region.

In FIGS. 11A and 11B, device isolating oxide layers 201, each with its thickness of approximately 4000 to 5000 angstroms, are formed on the substrate, by using the LOCOS method, etc. Tunnel oxide layers 203, each with its thickness of 100 angstroms or less, are formed next, in predetermined device regions. A polysilicon layer 202 is deposited next, all over the surface. The polysilicon layer 202 will become floating gates later. The polysilicon layer 202, with its thickness of approximately 1500 angstroms, is implanted with a phosphorous implant, generally.

Figure 12A:
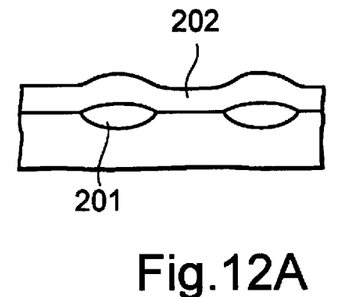
Figure 12B:
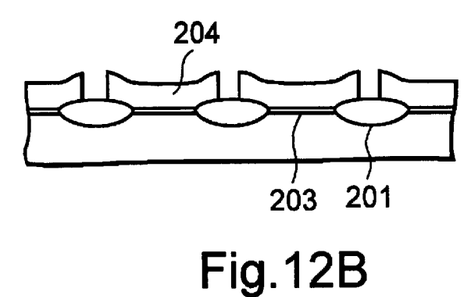

In FIGS. 12A and 12B, a photo-resist (not shown in figures,) is patterned next, by an ordinary step of the photo-lithography process. The polysilicon layer 202 is etched next, to form floating gates 204 (see FIG. 12B). Wherein, a resist is used, to cover all over the region of the peripheral circuit. According to the conventional techniques, however, the region of the peripheral circuit is not covered by a resist. In this respect, the flash memory manufacturing method, according to the present invention, is different from the conventional ones.

In FIGS. 13A and 13B, an insulating layer 205 is deposited next, all over the surface. The insulating layer 205 serves as an insulating layer, which insulates the floating gates 204 from the corresponding control electrodes, which will be formed later. The insulating layer 205 has a multiple layered structure, made up of, for example, a silicon oxide layer, a silicon nitride layer, and a silicon oxide layer, with its thickness of 180 angstroms or less, if it is converted into the thickness of an oxide layer. Since the polysilicon layer 202 remains in the region of the peripheral circuit, as opposed to the conventional techniques, the insulating layer 205 is formed on the polysilicon layer 202. Next, a resist 206 is coated, all over the cell region, in order to remove the insulating layer in the region of the peripheral circuit (FIG. 13B).

In FIGS. 14A and 14B, the insulation layer 205 and the polysilicon layer 202, in the region of the peripheral circuit are both etched. In the subsequent step, a gate oxide layer will be formed on the regions, where no device isolating oxide layer 201 exists in the region of the peripheral circuit. Therefore, the polysilicon layer 202, formed on the regions has to be completely removed, and thus, it is necessary to over-etch a suitable amount. In this embodiment, the etching selectivity of the polysilicon layer 202, to the device isolating oxide layers 201, which are located under the polysilicon layers 202, can be set to a high value. This prevents a possible loss of the device isolating oxide layer, in the region of the peripheral circuit from occurring, even though the polysilicon layer 202, is over-etched (see FIG. 14A).

Thereafter, gate oxide layers 211 for transistors, making up the region of the peripheral circuit are formed, through a thermal oxidation process. The gate oxide layer 206 varies in thickness, dependent upon the type of transistors. Specifically, there are, roughly two types of transistors, used in the region of the peripheral circuit, in the flash memory: a low voltage type and a high voltage type. The thickness of each gate oxide layer 211, of the low voltage type transistor, is equal to approximately 100 angstroms, whereas the thickness of each gate oxide layer 211, of the high voltage type transistor, is equal to approximately 250 angstroms.

In FIGS. 15A and 15B, a polysilicon layer 207, which is implanted with a phosphorous implant, and a silicide layer 208, are deposited all over the substrate in the order, as written above. Each thickness of them is equal to, approximately 1500 angstroms. The polysilicon layer 207 and the silicide layer 208 will become the gate electrodes of transistors, in the region of the peripheral circuit, by subjecting them to a subsequent process. They will also become the control electrodes of transistors in the cell region. Thereafter, the entire, region of the peripheral circuit and predetermined places of the cell region, are covered by a resist 209 for cell-gate etching.

The cell-gate etching is performed next, to form control gates, at predetermined places in the cell region. It is noted that no cell gate is illustrated in these places, since FIG. 16B is a cross-section along the line A–A' in FIG. 10.

Thereafter, source and drain regions (not shown in Figures,) are formed at predetermined places in the cell region. The entire cell region and the regions, where gates are to be formed, in the region of the peripheral circuit are all covered next, by a resist 210 (see FIGS. 16A and 16B). Etching is then performed, to form gates in the region of the peripheral circuit (FIG. 17A).

Transistors in the region of the peripheral circuit, are completed by forming source and drain regions of transistors in the region of the peripheral circuit. The flash memory is completed by subjecting it to a contact process and an interconnection process.

It is apparent, from the configuration in FIG. 13A, the device isolating oxide layers 201 are maintained, convex or flat in shape. This provides the flash memory with improved, device isolating characteristics.

According to the present invention, a layer of floating electrode material, deposited over device isolating oxide layers, which are formed on a substrate, and an insulating layer, which is used in a cell region to insulate a control electrode from a floating electrode, are deposited in the order, as written above. These layers are etched next. In this layered configuration, the etching selectivity, to the device isolating oxide layer can be set to a high value, for etching the a layer of floating electrode material, which has been deposited. This prevents a possible loss of the device isolating oxide layers, in the region of the peripheral circuit, from occurring. Thus, the device isolating characteristics of a non-volatile, semiconductor memory, such as a flash memory, according to the present invention, is improved.

The configuration and its manufacturing method, described up to this point, are of a flash memory, which is one type of the non-volatile semiconductor memory, according to the present invention. However, the present invention is not limited to the flash memory as described above. It also includes other types of EEPROM (Electrically Erasable Programmable Read-only Memory) and the ultraviolet erasable PROM.

While the present invention has been described in connection with certain preferred embodiments, it is to be understood, that the subject matter encompassed by the present invention, is not limited to those specific embodiments. On the contrary, it is intended to include all alternatives, modifications, and equivalents, as can be included within the spirit and scope of the following claims.

What is claimed is:

1. A method of forming a semiconductor device having a first portion and a second portion, comprising:

forming a first set of element isolating regions in said first portion and a second set of element isolating regions in said second portion;

forming a first insulating film on said first portion which is uncovered by said first set of element isolating regions;

forming a first conductive film on an entire surface of said first portion and said second portion;

selectively removing said first conductive film of said first portion while remaining said first conductive film of said second portion to form a plurality of conductive stripes on said first portion, each of said conductive stripes extending in parallel to said element isolating region to position over a corresponding part of said first portion defined by said element isolating regions;

forming a second insulating film on said conductive stripes of said first portion and on said first conductive film of said second portion; and removing said second insulating film and said first conductive film of said second portion to expose said semiconductor substrate uncovered by said second set of element isolating regions of said second portion.

2. The method as claimed in claim 1, said method further comprising:

selectively forming a third insulating film on said semiconductor substrate uncovered by said second set of element isolating regions of said second portion after said second insulating film and said first conductive film of said second portion are removed;

forming a second conductive film on said second insulating film of said first portion and said third insulating film of said second portion;

selectively removing said second conductive film, said second insulating film and said conductive layers of said first portion; and selectively patterning said second conductive film of said second portion to form a gate electrode of a transistor in said second portion.

3. The method as claimed in claim 1, wherein said first portion is a memory cell region and said second portion is a peripheral circuit region.

4. The method as claimed in claim 1, wherein said first conductive film is made of polysilicon.

5. The method as claimed in claim 1, wherein said element isolating regions are made of a silicon oxide.

6. The method as claimed in claim 1, wherein said first insulating film is made of a silicon oxide.

7. The method as claimed in claim 1, wherein each of said plurality of conductive layers is a floating gate.

8. The method as claimed in claim 1, wherein said first conductive film is selectively removed to expose the respective element isolating regions.

9. The method as claimed in claim 8, wherein each of conductive layers has ends thereof each formed on the respective element isolating regions.

10. A method of forming a non-volatile semiconductor memory device, comprising:

forming a conductive film which is used to be a floating gate over a memory cell region and a peripheral circuit region;

patterning said conductive film over said memory cell region while leaving said conductive film over said peripheral circuit region unpatterned;

forming an insulating film on top surface of said conductive film over said peripheral circuit region and on top and side surfaces of the patterned conductive film;

thereafter removing said conductive film and said insulating film over said peripheral circuit region while retaining said insulating film on top and side surfaces of said patterned conductive film;

forming a control gate material over said peripheral circuit region and said insulating film on top and side surfaces of said patterned conductive film; and selectively removing said control gate material, said insulating film and said patterned conductive film over said memory cell region while remaining said control gate material over said peripheral circuit region; and patterning said control gate material over said peripheral circuit region to form a control gate.

11. A method of forming a non-volatile semiconductor memory device, comprising:

forming a conductive film which is used to be a floating gate over a memory cell region and a peripheral circuit region;

patterning said conductive film over said memory cell region while leaving said conductive film over said peripheral circuit region unpatterned, a plurality of patterned conductive films being thereby formed, said patterned conductive films extending in parallel to each other in a first direction;

forming an insulating film on top surface of said conductive film over said peripheral circuit region and on top and side surfaces of the patterned conductive film;

removing said conductive film and said insulating film over said peripheral circuit region while retaining said insulating film on top and side surfaces of said patterned conductive film;

forming a control gate material over said peripheral circuit region and said insulating film on top and side surfaces of said patterned conductive film; and selectively removing said control gate material, said insulating film and said patterned conductive film over said memory cell region while remaining said control gate material over said peripheral circuit region, a plurality of control gate being thereby formed from said control gate material so that said control gates extend in parallel to each other in a second direction perpendicular to said first direction, a plurality of floating gates being thereby formed from said patterned conductive film below said control gates.

12. The method as claimed in claim 1, wherein said first conductive film of said first portion is selectively removed to expose said element isolation regions with preventing active regions surrounded by said element isolating regions from being exposed.

* * * * *